United States Patent
Nobuo et al.

(10) Patent No.: US 9,780,303 B2
(45) Date of Patent: Oct. 3, 2017

(54) THIN FILM FABRICATING APPARATUS AND MANUFACTURING METHOD OF ORGANIC LIGHT EMITTING DEVICE USING THE SAME

(71) Applicant: Samsung Electronics Co., Ltd., Suwon-si (KR)

(72) Inventors: Hamamoto Nobuo, Suwon-si (KR); Miyazaki Hiroshi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 137 days.

(21) Appl. No.: 14/719,066

(22) Filed: May 21, 2015

(65) Prior Publication Data
US 2016/0096185 A1 Apr. 7, 2016

(30) Foreign Application Priority Data
Oct. 6, 2014 (KR) .................. 10-2014-0134508

(51) Int. Cl.
*B05B 5/08* (2006.01)
*B05B 5/025* (2006.01)
(Continued)

(52) U.S. Cl.
CPC ........ *H01L 51/0003* (2013.01); *B05B 5/0255* (2013.01); *B05B 5/035* (2013.01);
(Continued)

(58) Field of Classification Search
None
See application file for complete search history.

(56) References Cited

U.S. PATENT DOCUMENTS 3,610,397 A * 10/1971 Bok ...................... B65G 47/252
118/314
6,158,844 A * 12/2000 Murakami ................ B41J 2/06
347/55
(Continued)

FOREIGN PATENT DOCUMENTS

JP 2007305507 11/2007
JP 2011173085 9/2011
(Continued)

OTHER PUBLICATIONS

European Search Report—European Application No. 15178304.0 dated Mar. 4, 2016, citing enumerated references cited within.
(Continued)

*Primary Examiner* — Binu Thomas
(74) *Attorney, Agent, or Firm* — Cantor Colburn LLP

(57) ABSTRACT

Embodiments of the invention are directed to a thin film fabricating apparatus which may be employed in mass production and may stably provide a uniform nano-order layer. An exemplary embodiment of a thin film fabricating apparatus includes: an electrode bath which contains a thin film-forming material; a plurality of needle electrodes disposed in the electrode bath; a plurality of ring electrodes disposed on the electrode bath at positions corresponding to the needle electrodes; and a substrate stand disposed opposite to the needle electrodes and the ring electrodes, where the substrate stand holds the substrate, on which a thin film is to be formed.

15 Claims, 13 Drawing Sheets

(51) Int. Cl.
*H01L 51/00* (2006.01)
*B05B 5/035* (2006.01)
*B05B 5/057* (2006.01)
*B05C 5/00* (2006.01)
*B05C 9/00* (2006.01)
*B05C 13/00* (2006.01)
*B05B 13/02* (2006.01)

(52) U.S. Cl.
CPC .......... *B05B 5/057* (2013.01); *H01L 51/0006* (2013.01); *B05B 13/0264* (2013.01); *B05C 5/00* (2013.01); *B05C 9/00* (2013.01); *B05C 13/00* (2013.01)

(56) References Cited

U.S. PATENT DOCUMENTS

| | | | |
|---|---|---|---|
| 2005/0024439 A1* | 2/2005 | Fukunaga | B41J 2/06 347/55 |
| 2005/0185020 A1* | 8/2005 | Fukunaga | B41J 2/06 347/54 |
| 2009/0056133 A1 | 3/2009 | Wait et al. | |
| 2014/0353860 A1* | 12/2014 | Velasquez-Garcia | B05B 5/0536 239/548 |

FOREIGN PATENT DOCUMENTS

| | | |
|---|---|---|
| JP | 2011175921 | 9/2011 |
| JP | 2011175921 A * | 9/2011 |
| JP | 2011181271 | 9/2011 |
| JP | 2012135704 | 7/2012 |
| JP | 2013093139 | 5/2013 |
| KR | 1020100042345 | 4/2010 |
| KR | 1020120032114 | 4/2012 |
| KR | 1020130062143 | 6/2013 |
| WO | 2006009854 | 1/2006 |
| WO | 2008044737 | 4/2008 |
| WO | 2009049566 | 4/2009 |
| WO | 2013105557 | 7/2013 |

OTHER PUBLICATIONS

A. Jaworek, "Electrospray droplet sources for thin film deposition", J Mater Sci, vol. 42, pp. 266-297, (2007).
A. Jaworek, et al., "Electrospraying route to nanotechnology: An overview", Journal of Electrostatics vol. 66, pp. 197-219, (2008).
J.M. L&opez-Herrera, et al., "Coaxial jets generated from electri ed Taylor cones. Scaling laws", Aerosol Science, vol. 34, pp. 535-552, (2003).
Jungmyoung Ju, et al., "Thin-Film Fabrication Method for Organic Light-Emitting Diodes Using Electrospray Deposition", Adv. Mater., vol. 21, pp. 4343-4347, (2009).
Lord Rayleigh, et al., "On the Equilibrium of Liquid", vol. 14, pp. 184-186, (1882).
N. Hamamoto, et al., "Experimental Discussion on Maximum Surface Charege Density of Fine Particles Sustainable in the Atmosphere", vol. 15, No. 6, pp. 452-458, (1991).
Robert Saf, et al., "Thin organic films by atmospheric-pressure ion deposition", Nature Materials, vol. 3, pp. 323-329, May 2004.
Static electricity Handbook, Technology using static electricity from among various kinds of liquids, Chapter 20, p. 698, (1980).
Takeshi Fukuda, et al., "Surface morphology of fluorene thin film fabricated by electrospray deposition technique using two organic solvents: Application for organic light-emitting diodes", Thin Solid Films, vol. 520, pp. 600-605, (2011).
Yasushi Koishikawa, et al., "Multi-layered organic light-emitting diode fabrication using low molecular weight materials by electrospray method", Thin Solid Films, vol. 545, pp. 527-532, (2013).
Yoshiyuki Seike, et al., "The Study of Film Formation Process by Electrospray Method to Manufacture High Productivity Organic Light-emitting Diode Devices", SID, p. 164L, (2014).
Hiroyuki Hiroyasu, "Liquid Atomization and Spray Combustion", (1997), vol. 12, No. 3, pp. 189-194.

* cited by examiner

THIN FILM FABRICATING APPARATUS AND MANUFACTURING METHOD OF ORGANIC LIGHT EMITTING DEVICE USING THE SAME

CROSS-REFERENCE TO RELATED APPLICATION

This application claims priority to Korean Patent Application No. 10-2014-0134508 filed on Oct. 6, 2014, and all the benefits accruing therefrom under 35 U.S.C. §119, the content of which in its entirety is herein incorporated by reference.

BACKGROUND

1. Field

The disclosure relates to a thin film fabricating apparatus and a method of manufacturing an organic light emitting device using the thin film fabricating apparatus.

2. Description of the Related Art

An organic electroluminescent ("EL") device is a current-driven type of light emitting device in which electrodes are typically disposed on opposing surfaces of a thin film including an organic material, and a voltage is applied between the electrodes to emit light by recombining electrons and holes injected into the organic thin film in both of the opposing electrodes. Thus, applications of such an organic EL device for a light-weight thin display, lighting and the like have been actively researched as the organic EL device may provide high luminescence with a low voltage, may emit light by itself, and may have high visibility.

A conventional method of fabricating an organic thin film mainly used for providing an organic EL device may include a dry process such as vacuum deposition or a wet process such as spin coating. The dry process is a coating process using a relatively low molecular organic material, to effectively control a thickness, to divide a coating area using a mask having an appropriate-sized hole, and to easily provide a structure stacked with organic materials having different characteristics. In the dry process, a multi-layering technique for providing a stacked structure may be effectively used to allow the luminance efficiency and the device life-span to be significantly improved. Thus, the organic EL device may be employed for many applications including a display device. However, in such a technique, vacuum equipment is used, so manufacturing cost in the early state of introducing the equipment or in the maintenance of equipment may be substantially high, and such technique may not be effectively used for manufacturing a large substrate. Thus, a productivity improvement with reduced cost may be restricted.

The wet process may be effectively used for mass production to fabricate a low-priced product since the wet process may be applied for a polymer material having stable physical properties such as high coating properties and heat resistance, the equipment is simplified, and a unique environment such as a vacuum may not be used. However, in the wet process, the solvent for a thin film forming material of an upper layer may be melted and smeared into the organic material of a lower layer to delaminate the lower layer by permeation. Accordingly, the fabricating of a stacked structure using materials having different characteristics, which is an important factor to accomplish high efficiency and a long life-span, as explained above, may not be effectively performed by the wet process. In the wet process, an additive such as a cross-linking hardener may be used to fabricate the stacked structure using materials having different characteristics, but the additive is known for deteriorating the light emitting function. Accordingly, the multi-layering structure having high performance without deteriorating the device function may not be effectively provided by the wet process.

Some proposals using an electro-spray ("ES") method for fabricating an organic light emitting device have been suggested because the ES method may provide a pattern in a simple way. The ES method includes spraying a solution of a functional material by applying a high voltage between a conductive substrate and a nozzle for emitting the solution to attach the solution onto a substrate. The electrified solution may be changed into fine liquid droplets having a nano-scale by mutual repulsion and dispersion, and the solvent is evaporated by rapidly increasing the surface area to attach only a solute (e.g., organic material) in the solution as a dried state onto the substrate to provide a uniform layer, to stack a plurality of layers.

A plurality of layers may be formed on a substrate in a nano-scale level using the ES method, but generally, the treatment time is substantially long, so the conventionally ES method may not be effectively used for a mass production, and the conventional ES method may have further limitations such as the electrolytic corrosion of parts, the pollution possibility, the maintenance, the lack of practicality, and the like.

SUMMARY

As described above, a conventional techniques, where a thin film-forming material is supplied from an inside of a narrow hallow needle, may not be effectively used to provide a uniform layer of a nano-scale by depositing particulate having a nano-scale level for the mass production and in the stable way.

Accordingly, embodiments of the invention are directed to a thin film fabricating apparatus which may be employed in mass production and may stably provide a uniform nano-order layer.

An exemplary embodiment of a thin film fabricating apparatus according to the invention includes: an electrode bath which contains a thin film-forming material; a plurality of needle electrodes disposed in the electrode bath; a plurality of ring electrodes disposed on the electrode bath in positions corresponding to the needle electrodes; and a substrate stand disposed opposite to the needle electrodes and the ring electrodes, where the substrate stand holds the substrate on which a thin film is to be formed.

In an exemplary embodiment, each of the needle electrodes may be disposed at a center axis of a ring electrode corresponding thereto.

In an exemplary embodiment, a first voltage, a second voltage, and a third voltage may be applied to the needle electrodes, the ring electrodes and the substrate, respectively, where the second voltage may have a same polarity as a polarity of the first voltage and an absolute value less than an absolute value of the first voltage, and the third voltage may have an opposite polarity to the polarity of the first voltage or may have the same polarity as the polarity of the first voltage and an absolute value less than the absolute value of the first voltage.

In an exemplary embodiment, the thin film fabricating apparatus may further include a supplying unit which supplies the thin film-forming material to the electrode bath, and a collecting unit which collects the thin film-forming material flowing from the electrode bath.

In an exemplary embodiment, the electrode bath may include a level controller which allows the thin film-forming material to flow into the collecting unit such that a level of thin film-forming material is substantially maintained at a first height.

In an exemplary embodiment, the height of needle electrode may be higher by a length in a range of about 0.15 millimeter (mm) to about 4 mm than the first height.

In an exemplary embodiment, the electrode bath may have a sloped surface at a predetermined angle to flow the thin film-forming material in a predetermined direction, the supplying unit may include a manifold and a slit, where the supplying unit may supply the thin film-forming material substantially consistently at a first height by dispersing the thin film-forming material onto the sloped surface of the electrode bath, and the collecting unit may be disposed at a lower end of the sloped surface of the electrode bath.

In an exemplary embodiment, the height of needle electrode may be higher by a length in a range of about 0.15 mm to about 4 mm than the first height.

In an exemplary embodiment, the substrate stand may include a reversing unit which reverses the substrate upside down.

In an exemplary embodiment, the reverser may include a conveyor belt, a fixing unit which fixes the substrate onto the conveyor belt, and a rotating unit which drives the conveyor belt and rotates the substrate fixed by the fixing unit.

In an exemplary embodiment, the fixing unit may include a reduced pressure suction apparatus.

In an exemplary embodiment, and the rotating unit may include a triangle roller.

In an exemplary embodiment, a terminal end of the needle electrode may have at least one of a pointed shape, a semi-pointed shape, a dome-like shape, a circular cylinder shape, a polygonal cylinder shape, and a caldera shape.

In an exemplary embodiment, the thin film fabricating apparatus may satisfy the following inequality: $(Vn-Vr)/Lr \leq 3{,}000{,}000$ (V/m), where Lr denotes a value of a distance between the lower end of the ring electrode and the upper surface of the thin film-forming material in the unit of meter, Vn denotes a value of a voltage of the needle electrode in the unit of volt, and Vr denotes a value of a voltage of the ring electrode in the unit of volt.

In an exemplary embodiment, the thin film fabricating apparatus may satisfy the following inequality: $(Vr-Vs)/Ls \leq 3{,}000{,}000$ (V/m), where Ls denotes a value of a distance between the upper end of the ring electrode and the lower surface of substrate in the unit of meter, Vr denotes a value of a voltage of the ring electrode in the unit of volt, and Vs denotes a value of a voltage of the substrate in the unit of volt.

In an exemplary embodiment, the thin film fabricating apparatus may satisfy the following inequality: $(Vr-Vs) \leq (Ls\rho g/6) \times (\pi D^3/2\gamma)^{1/3}$, where Ls denotes a value of a distance between the upper end of ring electrode and the lower surface of the substrate, Vr denotes a value of a voltage applied to the ring electrode, Vs denotes a value of a voltage applied to the substrate, $\rho$ denotes a value of specific gravity of the thin film-forming material in the unit of kilogram per cubic meter, g denotes a value of gravitational acceleration in the unit of square meter per second, D denotes a value of a diameter of the liquid droplet of the thin film-forming material in the unit of meter, and $\gamma$ denotes a value of surface tension of the liquid droplet of the thin film-forming material in the unit of Newton per meter.

In an exemplary embodiment, the needle electrode may include at least one of stainless steel, tungsten, and platinum.

In an exemplary embodiment, a method of manufacturing an organic light emitting device may include providing at least one organic film using the thin film fabricating apparatus described above.

DETAILED DESCRIPTION

Figure 1:
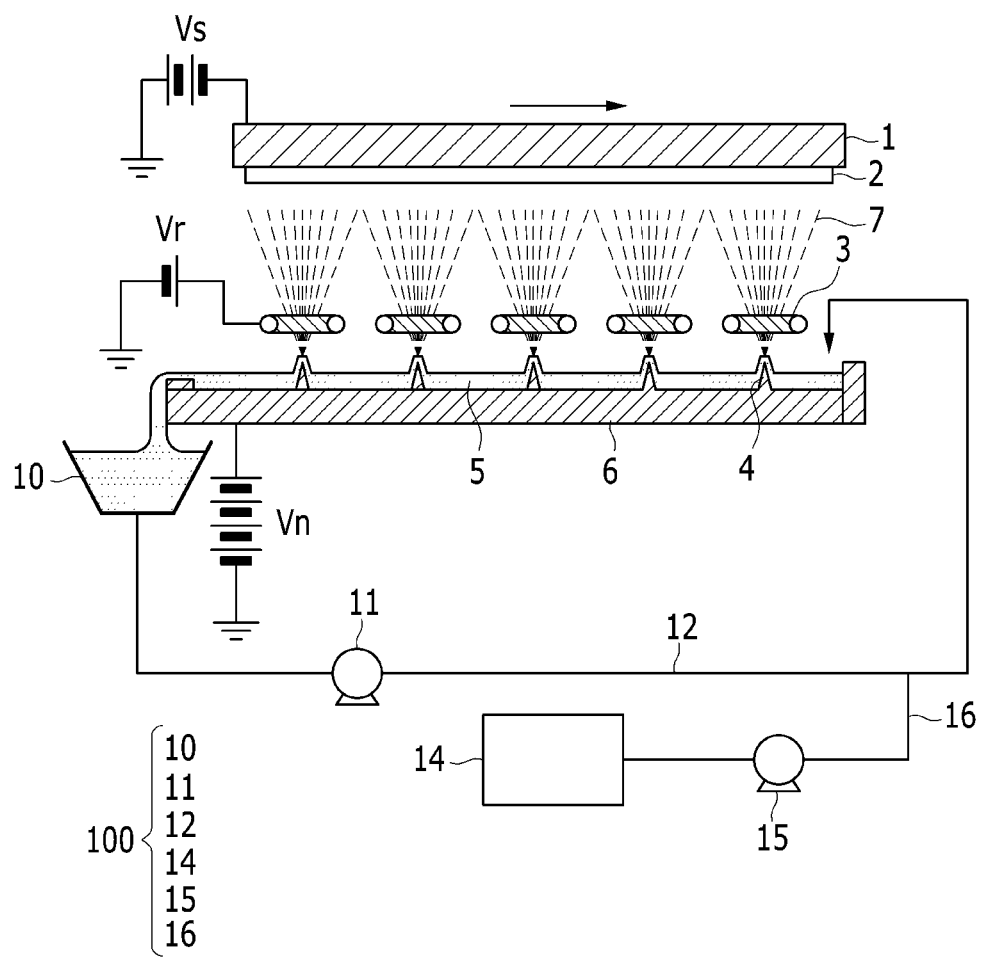
FIG. 1 is a schematic cross-sectional view of an exemplary embodiment of a thin film fabricating apparatus.

The embodiments now will be described more fully hereinafter with reference to the accompanying drawings, in which various embodiments are shown. These embodiments may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments will be described in further detail with reference to the accompanying drawings.

Figure 2:
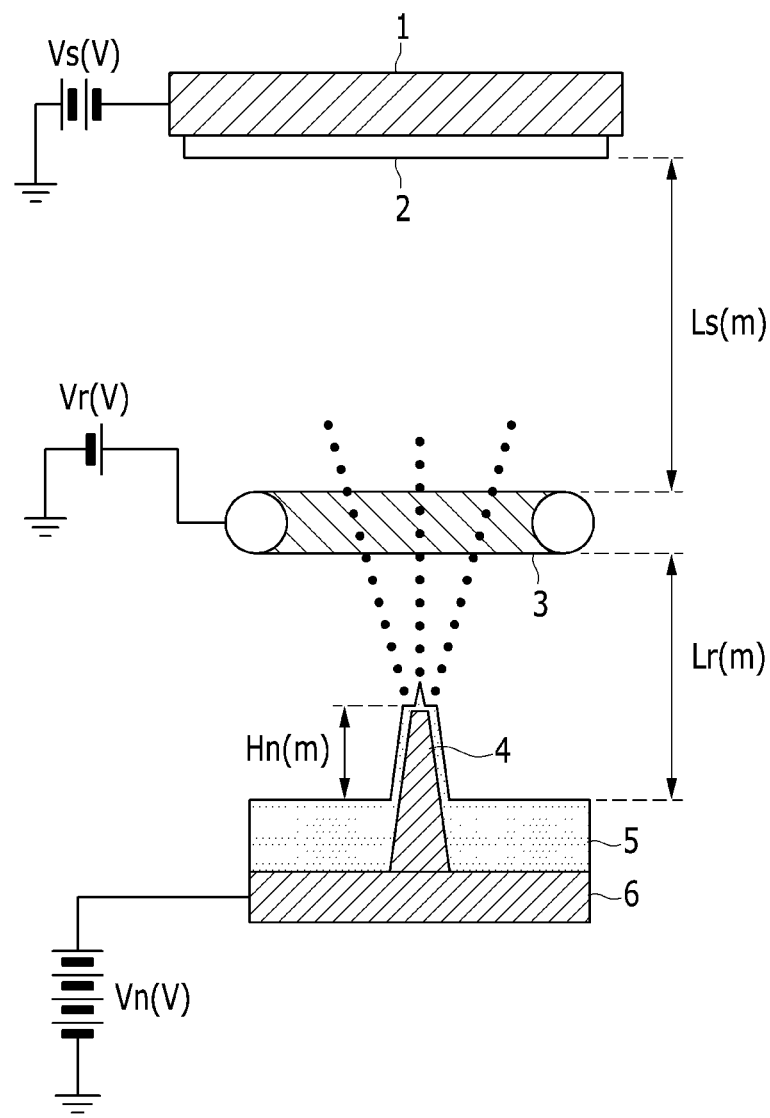
FIG. 2 is a schematic cross-sectional view showing a needle electrode, a ring electrode and a substrate stand of the thin film fabricating apparatus shown in FIG. 1.
Figure 3:
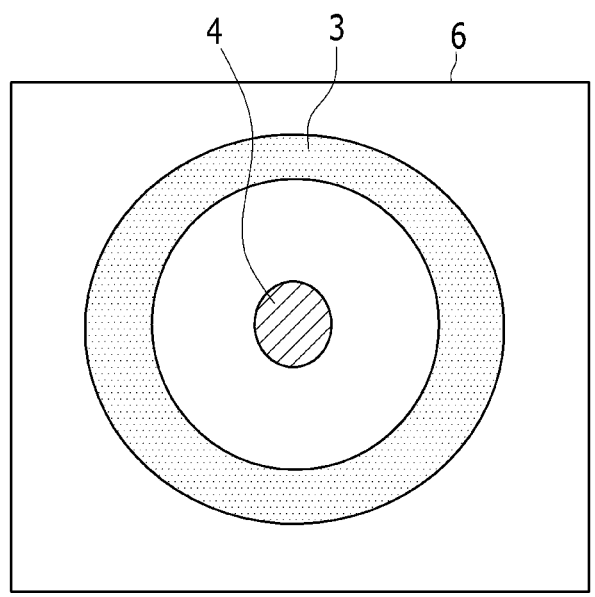
FIG. 3 is a top plan view showing a needle electrode and a ring electrode of the thin film fabricating apparatus shown in FIG. 1.
Figure 4:
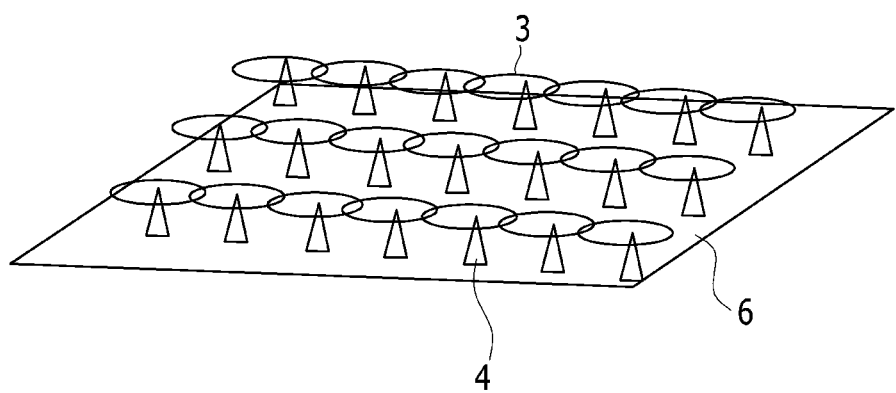
FIG. 4 is a perspective view showing an arrangement of needle electrodes and ring electrodes in an exemplary embodiment of the thin film fabricating apparatus.

FIG. 1 is a schematic cross-sectional view of an exemplary embodiment of a thin film fabricating apparatus; FIG. 2 is a schematic cross-sectional view showing a needle electrode, a ring electrode and a substrate stand of the thin film fabricating apparatus shown in FIG. 1; FIG. 3 is a top plan view showing a needle electrode and a ring electrode of an exemplary embodiment of a thin film fabricating apparatus shown in FIG. 1; and FIG. 4 is a perspective view showing an arrangement of a needle electrode and a ring electrode in of an exemplary embodiment of a thin film fabricating apparatus.

An exemplary embodiment of the thin film fabricating apparatus includes a substrate stand 1, a substrate 2 disposed on the substrate stand 1, a needle electrode bath 6 disposed opposite to the substrate stand 1 and including a plurality of needle electrodes 4 disposed on a surface thereof in a predetermined arrangement, a plurality of ring electrodes 3 disposed to facing the needle electrodes 4, respectively, and a material supplying and collecting unit (also referred to as "material supplier") 100 that supplies a thin film-forming material 5 to the needle electrode bath 6 and collects the thin film-forming material 5 to be recycled from the needle electrode bath 6.

In an exemplary embodiment, the substrate stand 1 may be a device for holding the substrate 2 on a surface thereof (e.g., a bottom surface) to face the needle electrodes 4 and the ring electrodes 3 such that a thin film may be formed on the substrate 2. In such an embodiment, the substrate stand 1 fix the substrate 2 on a surface thereof using a fixing apparatus or device such as a suction unit (e.g., a suction device) and provides (e.g., transfers) the substrate 2 into a thin film-forming region to be disposed on the needle electrode 4 and the ring electrode 3, and moves the substrate 2 formed with thin film in a predetermined direction to discharge and transfer the substrate 2 to a next process. The substrate stand 1 will be described later in greater detail.

In an exemplary embodiment, the needle electrode bath 6 includes the plurality of needle electrodes 4 disposed on a surface thereof in a predetermined form, e.g., substantially in a matrix form. In such an embodiment, the needle electrode bath 6 may include a wall that surrounds the needle electrodes 4 and contains the liquid thin film-forming material 5 in a predetermined height. In such an embodiment, a part of the wall (also referred to as "liquid level controlling part" or "liquid level controller") may have a lower height than other portions of the wall to overflow the thin film-forming material therethrough.

In such an embodiment, the height of thin film-forming material 5 may be substantially constantly maintained in the needle electrode bath 6 by the liquid level controlling part, and the thin film-forming material 5 overflowing through the liquid level controlling part may be collected by a collector 10. The needle electrodes 4 may be disposed in a regular (e.g., constant) interval in the needle electrode bath 6, and may have various sharp or pointed shapes to provide a Taylor cone. In an alternative exemplary embodiment, the interval of needle electrodes 4 may be irregular, and may be changed in a predetermined pattern. The height of the needle electrodes 4 is higher at a predetermined level than the height of the thin film-forming material 5 in the needle electrode bath 6. The height difference (Hn) between the needle electrodes 4 and the thin film-forming material 5 may be in a range of about 0.25 millimeter (mm) to about 4 mm. The needle electrode bath 6 may include or be made of a conductor to apply potential to the needle electrode 4. In one exemplary embodiment, for example, only a part of the needle electrode bath 6 that contacts the needle electrode 4 may include or be made of a conductor. In one exemplary embodiment, for example, the needle electrode 4 may include stainless steel, tungsten, or platinum. The needle electrode bath 6 will be described later in greater detail.

In an exemplary embodiment, as shown in FIG. 4, the ring electrodes 3 may be connected to each other in series, or may be connected in directions crossing each other to form a net-like shape. In such an embodiment, a predetermined voltage may be applied to the ring electrode 3. Each ring electrode 3 is arranged to correspond to the needle electrode 4. In one exemplary embodiment, for example, each ring electrode 3 may be disposed to allow a center point or axis thereof to overlap the corresponding needle electrode 4 as shown in FIG. 3. In such an embodiment, the ring electrodes 3 may be spaced apart from the upper surface of the thin film-forming material 5 at a predetermined distance and spaced apart from the surface of the substrate 2 at a predetermined distance as shown in FIG. 2. In an exemplary embodiment, the ring electrode 3 may be disposed at a position satisfying the following inequality: $(Vn-Vr)/Lr \leq 3,000,000$ (V/m), where Lr denotes a value (e.g., an absolute value) of a distance between the lower end of the ring electrode 3 and the upper surface of the thin film-forming material 5 in the unit of meter; Vn denotes a value of a voltage of the needle electrode 4 in the unit of volt; and Vr denotes a value of a voltage of the ring electrode 3 in the unit of volt.

In such an embodiment, the ring electrode 3 and the substrate 2 may be disposed at a position satisfying the following inequality: $(Vr-Vs)/Ls \leq 3,000,000$ (V/m), where Ls denotes a value of a distance between the upper end of the ring electrode 3 and the lower surface of the substrate 2 in the unit of meter; Vr denotes a value of a voltage of the ring electrode 3 in the unit of volt; and Vs denotes a value of a voltage of the substrate 2 in the unit of volt. In such an embodiment, the ring electrode 3 induces the progressing direction of sprayed droplets of the thin film-forming material 5.

In an exemplary embodiment, the material supplying and collecting unit 100 includes a material storage 14 that contains the liquid thin film-forming material 5, a supply pump 15 that pumps the material 5 from the material storage 14 and supplies the material through a material supply path 16 to the electrode bath 6, the collector 10 that receives the material overflowing from the electrode bath 6 and temporary stores the material, and a resupply pump 11 that pumps the material stored in the collector 10 and resupplies the material through a resupply path 12 to the electrode bath 6. In an exemplary embodiment, as shown in FIG. 1, the material supply path 16 and the resupply path 12 may be connected to each other, such that the material 5 to be supplied to the electrode bath 5 may be a mixed material of the collected material and a freshly supplied material. In an alternative exemplary embodiment, the supply path 16 and the resupply path 12 may be disconnected from each other to supply the material to the electrode bath 6 independently of each other. The supply pump 15 and the resupply pump 11 may be controlled to be interlocked with each other.

Hereinafter, an exemplary embodiment of the electrode bath 6 of the thin film fabricating apparatus will be descried in detail.

FIG. 5 is a schematic cross-sectional view showing a needle electrode bath and a material collecting unit of an exemplary embodiment of the thin film fabricating apparatus; FIG. 6 is a schematic cross-sectional view showing a needle electrode bath and a material collecting unit of an alternative exemplary embodiment of the thin film fabricating apparatus; and FIG. 7 to FIG. 10 are cross-sectional views showing various exemplary embodiments of the needle electrode.

In an exemplary embodiment, referring to FIG. 5, the electrode bath 6 includes a container having a flat bottom portion, and a wall surrounding a circumference of the flat bottom portion and having a predetermined height to contain the thin film-forming material 5. In such an embodiment, a liquid level controlling unit 61 may be defined in a portion of the wall. The height of liquid level controlling unit 61 is controlled to be lower than the height of other parts of the wall, such that the thin film-forming material 5 may be allowed to overflow through the liquid level controlling unit 61 when the liquid level of thin film-forming material 5 is higher than the height of the liquid level controlling part to uniformly maintain the liquid level of thin film-forming material in the electrode bath 6. The liquid level controlling unit 61 may be defined in a position that is substantially far from a place where the thin film-forming material 5 is injected, or may be defined in a plurality of positions with a predetermined interval therebetween. The height of the liquid level controlling unit 61 may be lower at a predetermined level than the heights of the plurality of needle electrodes 4 disposed on the flat bottom of the electrode bath 6. In such an embodiment, the height of the liquid level controlling unit 61 is determined to provide the height difference between the needle electrode 4 and the liquid level controlling unit 61 that is higher than the height difference (Hn) between the needle electrode 4 and the thin film-forming material 5 due to the surface tension of the thin film-forming material 5 or the like. In one exemplary embodiment, for example, when the height difference (Hn) between the needle electrode 4 and the thin film-forming material is in a range of about 0.25 mm to about 4 mm, the height difference between the needle electrode 4 and the liquid level controlling unit 61 may be in a range of about 0.45 mm to about 4.2 mm.

The needle electrodes 4 disposed in the electrode bath 6 may be arranged in a predetermined form, e.g., in a matrix form, in a concentric circle form or the like, and the interval between the needle electrodes 4 may be regular or irregular. In one exemplary embodiment, for example, the needle electrodes 4 may have a wider interval in the center part of the electrode bath 6 and a narrower interval in the circumference edge of the electrode bath 6. The terminal end of the needle electrode 4 may have a pointed shape sharpening toward the end point such as a cone and a pyramid, or as shown in FIG. 7 to FIG. 10, may have a truncated cone shape or a truncated pyramid shape (FIG. 7, referred as "a semi-pointed shape"), a circular cylinder or a polygonal cylinder shape (FIG. 8), a hemispherical or hemi-oval dome shape (FIG. 9, referred as "a dome-like shape"), a caved-in bowl shape hemisphere or cone (FIG. 10, referred as "a caldera shape"), and the like. In one exemplary embodiment, for example, the radius of the circle of the terminal end of the needle electrode 4, which indicates the pointed degree thereof, may be less than or equal to about 100 micrometers (am), but is not limited thereto. In such an embodiment, the pointed degree of the terminal end of the needle electrode 4 may be variously modified as long as fine liquid droplet is sprayed thereby.

In an alternative exemplary embodiment, as shown in FIG. 6, the electrode bath 6 is sloped in a predetermined slope (e.g., a slope in a range of about 1 degree to about 5 degrees), and the thin film-forming material 5 is uniformly dispersed and supplied in the top region of the electrode bath 6 and flows down over the electrode bath 6. The electrode bath 6 may have a shape of a rectangle or square, the sides where the thin film-forming material 5 is injected and flows down to the collector 10 may not include a portion of the wall, and the wall is disposed on the two sloped sides. In such an embodiment, the thin film-forming material 5 may be effectively prevented from flowing down over the two sides. On the supplying side of thin film-forming material 5, a manifold 62 may be defined, to uniformly disperse the thin film-forming material 5 and to supply the thin film-forming material 5 into an injection side of the electrode bath 6. The supplying amount of thin the film-forming material 5 is adjusted based on the determined height difference (Hn) between the needle electrode 4 and the thin film-forming material 5, and the height difference (Hn) between the needle electrode 4 and the thin film-forming material 5 may be in a range of about 0.25 mm to about 4 mm.

Figure 5:
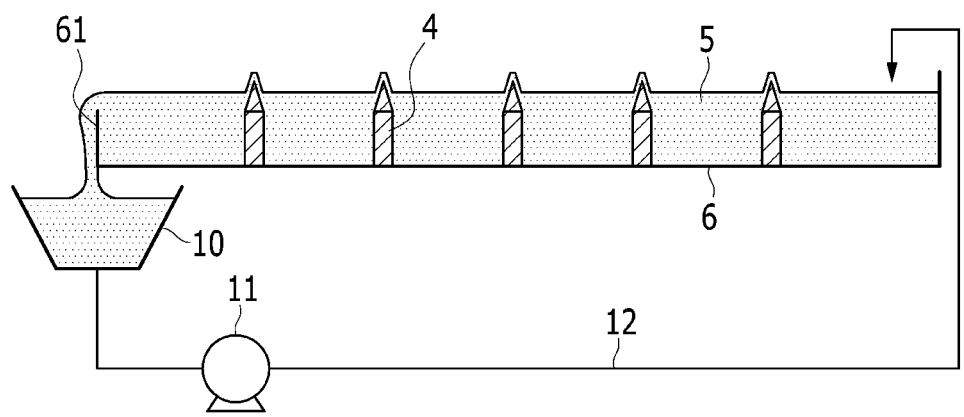
FIG. 5 is a schematic cross-sectional view showing a needle electrode bath and a material collecting unit of an exemplary embodiment of the thin film fabricating apparatus.

The arrangement of the needle electrode 4 and the terminal end shape of the needle electrode 4 or the like may be variously changed as in the embodiment shown in FIG. 5.

Figure 6:
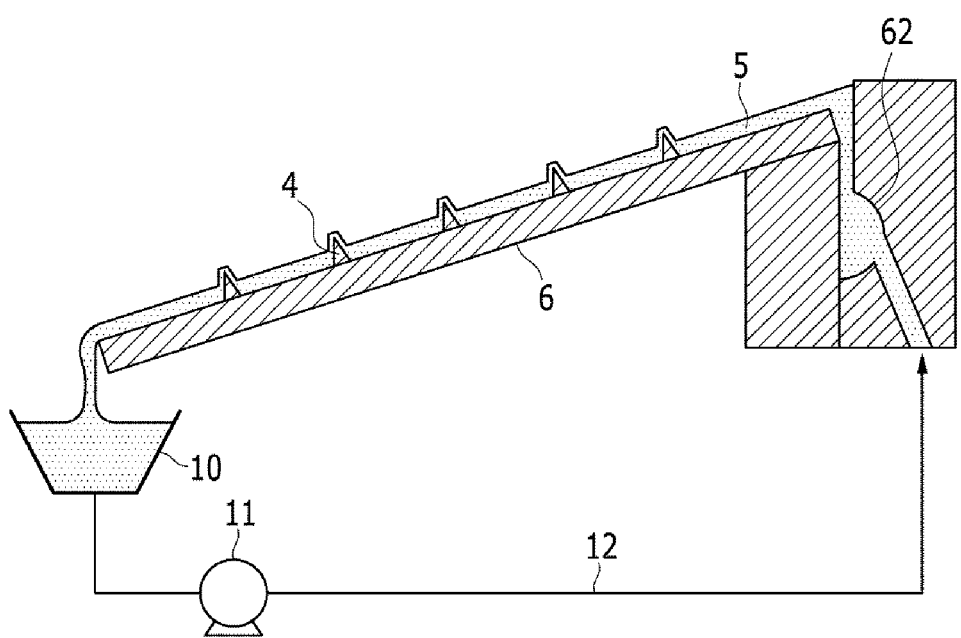
FIG. 6 is a schematic cross-sectional view showing a needle electrode bath and a material collecting unit of an alternative exemplary embodiment of the thin film fabricating apparatus.
Figure 7:
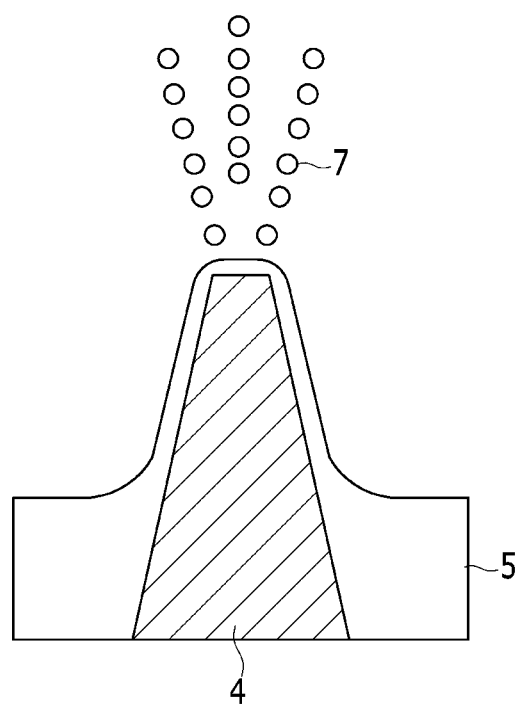
FIG. 7 to FIG. 10 are cross-sectional views showing exemplary embodiments of the needle electrode.
Figure 8:
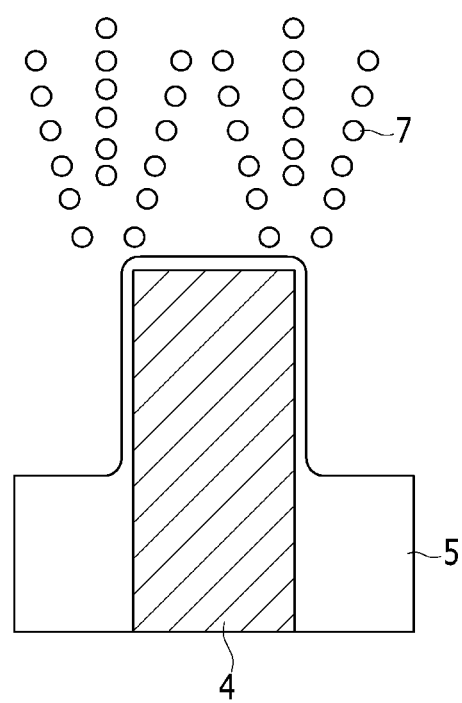
Figure 9:
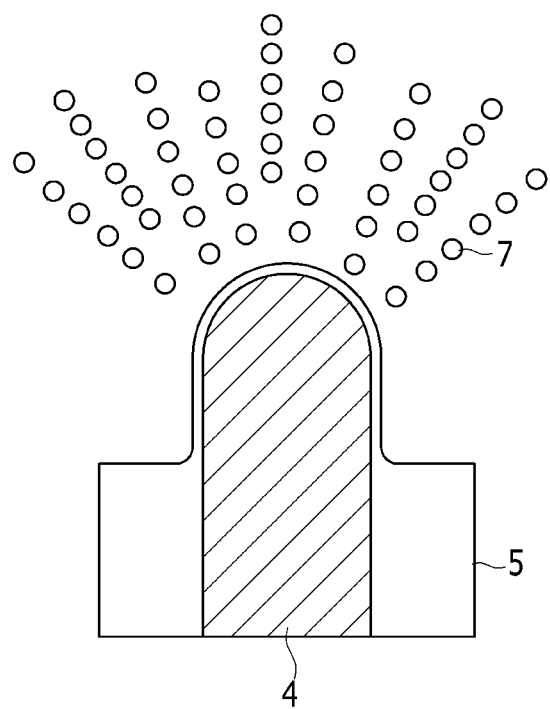
Figure 10:
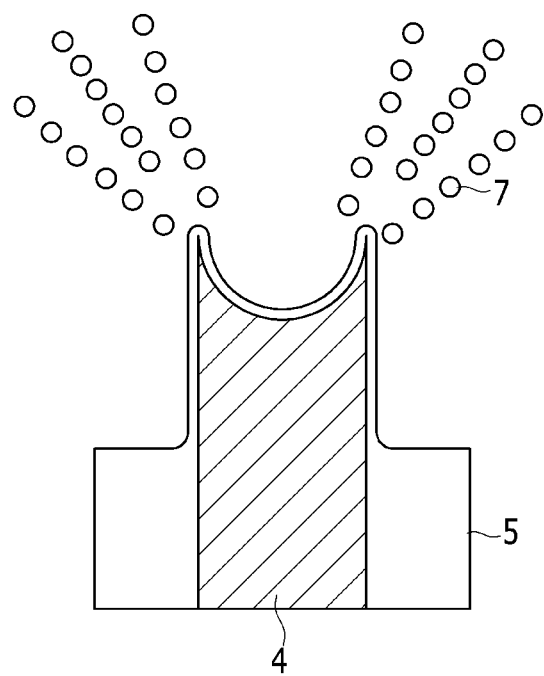

In an exemplary embodiment, as shown in FIG. 6, when the electrode bath 6 is disposed to be sloped, the substrate stand 1 may also be sloped at substantially the same angle as in the electrode bath 6.

Hereinafter, the structure of an exemplary embodiment of the substrate stand will be described in greater detail.

Figure 11:
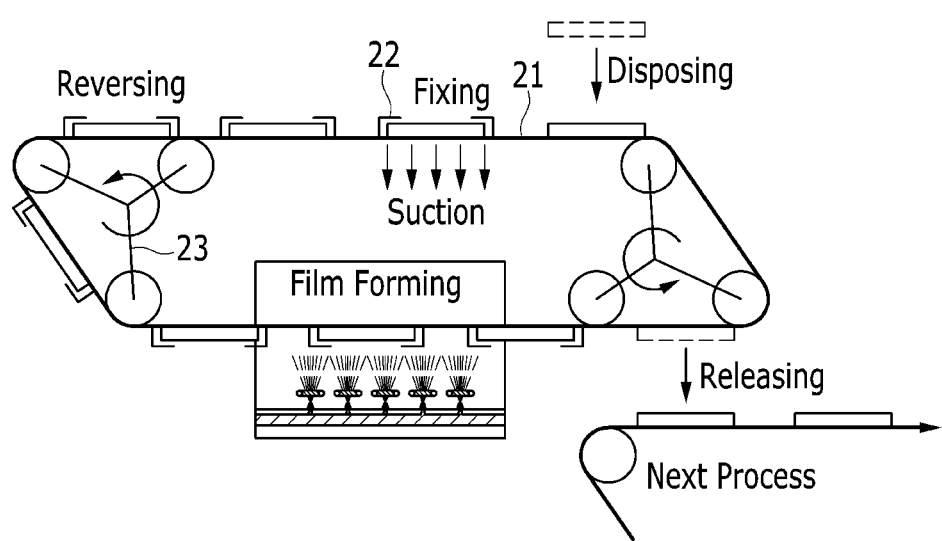
FIG. 11 is a schematic cross-sectional view of a substrate stand of an exemplary embodiment of a thin film fabricating apparatus.
Figure 12:
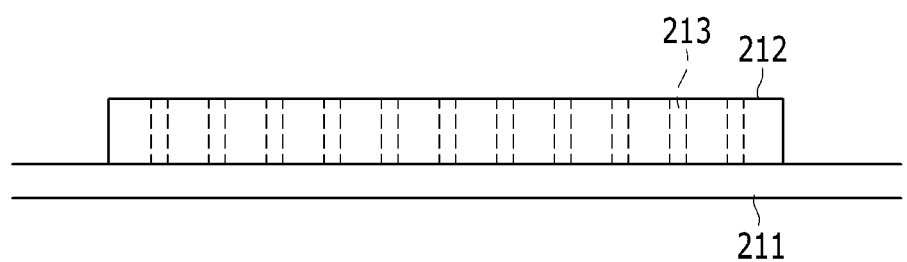
FIG. 12 is a schematic cross-sectional view of a reduced pressure suction-type substrate stand of an exemplary embodiment of a thin film fabricating apparatus.

FIG. 11 is a schematic cross-sectional view of a substrate stand of an exemplary embodiment of a thin film fabricating apparatus, and FIG. 12 is a schematic cross-sectional view of a reduced pressure suction-type substrate stand of an exemplary embodiment of a thin film fabricating apparatus.

In an exemplary embodiment, the substrate stand includes a conveyor belt 21, a fixing unit 22 for fixing the substrate at regular intervals, and a triangle roller 23 for circulating the conveyor belt 21 and reversing the substrate fixed by the fixing unit 22 upside down while maintaining the substrate to not be folded or bent.

The fixing unit 22 may be a structure defined on the conveyor belt 21 and that allows the substrate to be fixed onto a surface of the conveyor belt 21. In one exemplary embodiment, for example, the fixing unit 22 may include a clamp that directly contacts and fixes the substrate or a reduced pressure suction-type device for fixing the substrate using air pressure. In an exemplary embodiment, as shown in FIG. 12, where the fixing unit 22 includes the reduced pressure suction-type device, the reduced pressure suction-type device may have a reduced pressure suction plate 212 attached on the conveyor belt 211, and a plurality of suction holes 213 are defined on the reduced pressure suction plate 212. The substrate is disposed on the reduced pressure suction plate 212 and sucked with air through the suction holes 213 to attach the substrate onto the reduced pressure suction plate 212.

In an exemplary embodiment, as shown in FIG. 11, when the substrate fixed by the fixing unit 22 on the conveyor belt 21 is moved on a side of the triangle roller 23, all triangle rollers 23 may be rotated to reverse the substrate upside down. The reversed substrate is moved into a thin film fabricating chamber, in which a thin film fabricating apparatus is disposed, by the conveyor belt 21 to perform a thin film forming process, and the thin film-formed substrate is released by the fixing unit 22 after moving out the thin film fabricating chamber and loaded on an apparatus for moving the substrate to a next process. In an alternative exemplary embodiment, the triangle roller 23 may be substituted by a polygonal roller with a shape such as a rectangle or pentagon. In such an embodiment, a plurality of thin film fabricating chambers may be successively disposed to continuously form a plurality of thin films.

Hereinafter, the operation of an exemplary embodiment of a thin film fabricating apparatus will be described in detail.

An exemplary embodiment of the thin film fabricating apparatus may include an electrostatic deposition ("ESD") device using Rayleigh instability. The Rayleigh instability is a phenomenon in which the electrostatic repulsive force caused by the surface charge inhibits the liquid surface decline by the surface tension when the liquid surface is electrified. When the repulsive force caused by the electrified surface charge is stronger than the surface tension, a liquid is separated to emit fine liquid droplets with a charge. Herein, ESD refers to a thin coating technique in which the fine liquid droplets are emitted by applying a high voltage to a needle end to be deposited on the substrate.

In an exemplary embodiment, when the high voltage is applied to a cylindrical needle, the Rayleigh instable phenomenon occurs at the needle end. In such an embodiment, when the charge caused by the high voltage stays on the surface to provide a stronger electrostatic repulsive force than the surface tension forming the liquid curvature at the needle end, the liquid surface is changed from a convex (凸) shape to a concave (凹) shape at the needle end. As a result, the concave (凹)-shaped terminal end becomes a cone shape called a Taylor cone, and fine liquid droplets are discharged at the point of the Taylor cone, which is called. In such an embodiment, the emitted liquid droplets may be sprayed at a size (e.g., a diameter) in a range of about 1 μm to about 7 μm under appropriate conditions and methods.

The liquid droplets sprayed with a size of a micrometer unit have a very large specific surface area, such that drying may be performed at a high speed. Accordingly, the surface area of the liquid droplets is decreased while maintaining a charge during the drying process, so the charge density is increased by performing the drying, and the electrostatic repulsive force is enhanced to repeat atomization. However, the liquid droplet having a size of less than or equal to about 1 μm may lose the charge thereof by corona discharge caused by a strong electrical field formed by the surface charge, thereby not being further divided. When the liquid droplets contain a solid, the liquid droplets are evaporated to provide a solid particulate.

EDS is a process of providing a layer by attaching and depositing the particulate formed as described above on a surface of a substrate and the like. Using the ESD, a thin layer having a nano-unit may be obtained. Liquid is volatilized on the deposition. Thus, when a plurality of layers are formed with a liquid having different compositions according to ESD, a layer may be formed without the phenomenon that a liquid is smeared to adjacent layers to be mixed together, so such a method may be effectively used for coating a low molecular material for fabricating an organic electroluminescent device.

In an exemplary embodiment of the thin film fabricating apparatus, as shown in FIG. 1, a high voltage is applied in a state that the needle electrode bath 6 having a plurality of needle electrodes 4 is filled with the liquid thin film-forming material 5. The high voltage means a voltage of greater than or equal to about 5 kilovolts (kV) in the region where the corona discharge occurs when a direct current ("DC") voltage is applied at the end of the pointed needle electrode 4. Each needle electrode 4 may be disposed on the center axis of the corresponding ring electrode 3 mounted adjacent to the needle electrode 4, but the discharge disorder may not occur even if the center axis is twisted. The terminal end of the needle electrode 4 is disposed at the higher position at Hn than the liquid surface of the thin film-forming material 5.

In the state where a voltage is not applied, the needle electrode 4 is exposed on the thin film-forming material 5, but the liquid surface is inclined by the SUMOTO effect when applying the high voltage.

The sprayed liquid droplets are moved by the potential difference between the ring electrode 3 and the substrate stand 1 and attached to the substrate 2. The ring electrode 3 may be applied with a low polar potential (a potential having a low absolute value or a ground potential) to not attach liquid droplets 7 onto the ring electrode 3. The low potential means a potential of less than or equal to about 1 kV, or a potential that effectively prevents insulation breaking from occurring.

The potential of the substrate stand 1 may be substantially low and have an opposite polarity to the electricity of the liquid droplets 7 to effectively attach the liquid droplets onto the substrate. In one exemplary embodiment, for example the substrate stand 1 may have a ground potential. The low potential of the substrate stand 1 means a potential of less than or equal to about 1/100 of the potential of the needle electrodes 4.

In an exemplary embodiment, the thin film forming function may be more effectively achieved when the terminal end of in needle electrode 4 is disposed higher by a length in a range of about 0.25 mm to about 4 mm than the liquid surface of the supplied thin film-forming material 5. In such an embodiment, the liquid droplets 7 of thin film-forming material form a Taylor cone by the electric field focused on the terminal end of the needle electrode 4 and are then sprayed after inclining the thin film-forming material 5 displaced lower than the needle electrode 4 up to the terminal end of the needle electrode 4.

In such an embodiment, the terminal end of the needle electrode 4 may be disposed higher than the thin film-forming material 5 by as much as the electric field is focused, but the thin film-forming material 5 may not be completely inclined when the position of the needle electrode 4 end is too high. Accordingly, the terminal end of the needle electrode 4 may have a height as much as the liquid surface of thin film-forming material 5 may be inclined, and also the electric field focus may occur.

The liquid surface incline may be performed according to the SUMOTO effects. The SUMOTO effects means a phenomenon that the liquid surface is inclined to be sprayed by injecting a needle onto the liquid surface and applying a voltage thereto. The relationship between the liquid surface incline (H (mm)) and the voltage (kV) may be represented by the following Equation 1.

$$H = a \times V^b \qquad \text{[Equation 1]}$$

Figure 13:
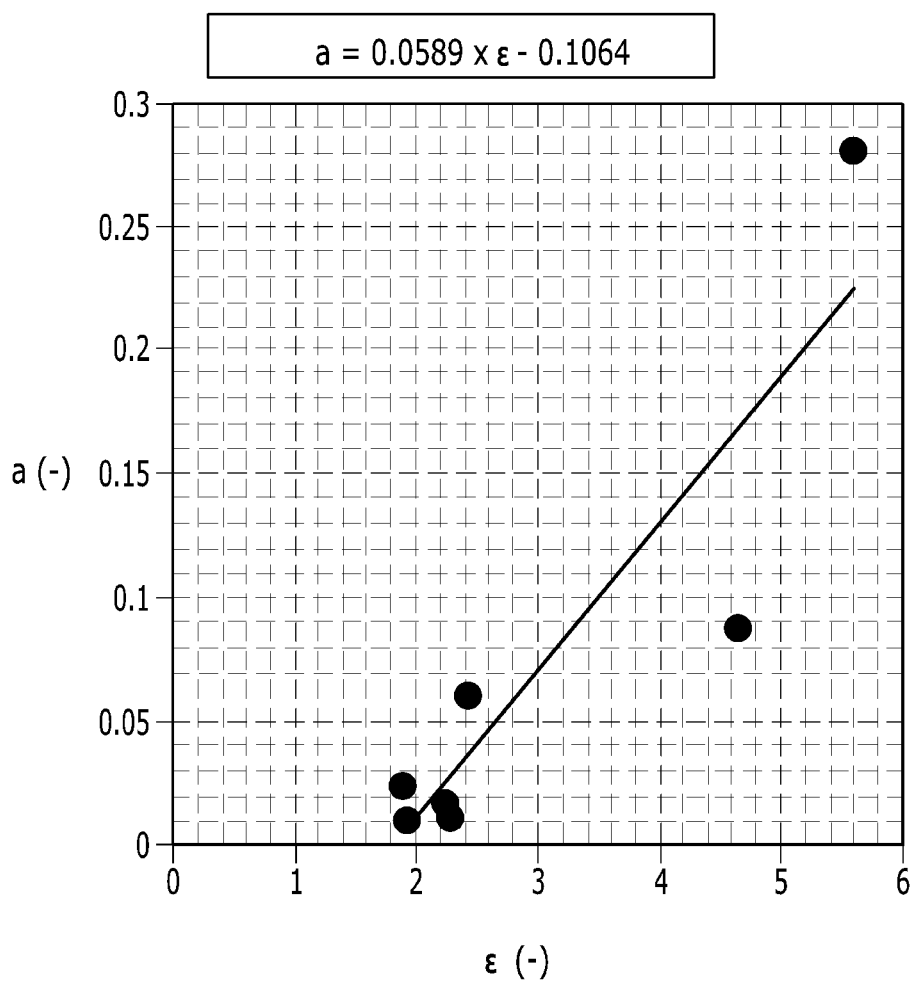
FIG. 13 is a graph showing a correlation between relative permittivity c and a value 'a'.

Here, 'a' and 'b' denote constants that vary depend upon the kind of solvent, but the value of 'b' may be determined as 2 since 'b' is in a range of about 1.8 to about 2.2. Further, the value of 'a' may be in a range from about 0.01 to 0.3, but was derived that the value of 'a' is correlated with the relative permittivity ε from results investigated by the inventors as shown in FIG. 13. The relationship of the value 'a' and the relative permittivity ε shown in FIG. 13 may be represented by the following Equation 2:

$$a = 0.0589 \times \varepsilon - 0.1064 \qquad \text{[Equation 2]}$$

Table 1 shows the results of calculating the liquid surface incline and the applied voltage of a solvent generally used in ESD using Equation 1 and Equation 2.

In ESD, the electrostatic spray may occur when applying voltage having greater than or equal to about 5 kV. Here, the applied voltage may be less than or equal to about 20 kV to simplify the electrically insulating maintenance facility structure. Accordingly, in an exemplary embodiment, the needle electrode 4 may have a height as much as the liquid surface may be inclined when the applied voltage is in a range from about 5 kV to 20 kV. As shown in Table 1, the solvent having a low polarity such as toluene or xylene may be desired to have a height of at least about 0.15 mm. In such an embodiment, a height of the needle electrode 4 may be less than or equal to about 5 mm to effectively prevent the discharging or spraying from repeatedly occurring due to excessive height thereof. Accordingly, in an exemplary embodiment, the terminal end of the needle electrode 4 may be positioned higher by a length in a range of about 0.25 mm to about 4 mm than the liquid surface to effectively accomplish the thin film forming function.

TABLE 1

| | ε relative permittivity | a [calculated by Equation 2] | H [calculated by Equation 1] | | | |
|---|---|---|---|---|---|---|
| | | | V = 5 kV | V = 10 kV | V = 15 kV | V = 20 kV |
| Toluene | 2.3 | 0.03 | 0.15 mm | 1.5 mm | 22 mm | 436 mm |
| Xylene | 2.3 | 0.03 | 0.15 mm | 1.5 mm | 22 mm | 436 mm |
| MEK | 18.5 | 0.98 | 4.9 mm | 49 mm | 737 mm | 15,000 mm |
| Acetone | 20.7 | 1.11 | 5.6 mm | 56 mm | 834 mm | 16,700 mm |

In an exemplary embodiment, a distance Lr (in the unit of meter: m) from the lower end of the ring electrode 3 and the liquid surface of the thin film-forming material 5 and the voltage Vn (in the unit of volt: V) of the needle electrode 4, and the voltage Vr (in the unit of V) of the ring electrode 3 satisfies the following inequality: $\{(Vn-Vr)/Lr\} \leq 3,000,000$ (V/m), such that the thin film may be more effectively formed. Such a relationship between the distance Lr from the lower end of the ring electrode 3 and the liquid surface of the thin film-forming material 5 and the voltage Vn of the needle electrode 4, and the voltage Vr of the ring electrode 3 will now be described in greater detail.

In such an embodiment, a high voltage (Vn) is applied to the needle electrode 4. In such an embodiment, Vr applies the same polarity as the polarity of Vn to not be attached with liquid droplets, and acts as a ground to provide a high electric field to Vn and Vr. In such an embodiment, the liquid surface has the same potential as the potential of the needle electrode 4, so the liquid surface potential may be Vn. Accordingly, when the electric field strength between Vn and Vr is greater than the insulation breakdown strength of air, the ignition discharge occurs, such that the ESD effects may not be provided. The insulation breakdown strength of air is generally known to be about 3 megavolts per meter (MV/m). Accordingly, the electric field strength of surface of the ring electrode 3 and the liquid surface may be less than or equal to about 3 MV/m. The electric field strength of the liquid surface and the surface of the ring electrode 3 may be calculated by Equation 3.

$$E = (Vn - Vr)/Lr \qquad \text{Equation 3}$$

In such an embodiment, the inequality, $\{(Vn-Vr)/Lr\} \leq 3000000$ (V/m), may be satisfied to obtain E of less than or equal to about 3 MV/m. Accordingly, in such an embodiment, the relationship between a distance Lr (in the unit of m) from the lower surface of the ring electrode 3 and the coating liquid surface, the voltage Vn (in the unit of V) of the needle electrode 4, and the potential Vr (in the unit of V) of the ring electrode 3 satisfies the following inequality: $\{(Vn-Vr)/Lr\} \leq 3{,}000{,}000$ (V/m), such that the thin film may be substantially effectively formed.

In an exemplary embodiment, where the relationship between a distance Ls (in the unit of meter) from the upper surface of the ring electrode 3 to the lower surface of the substrate, the voltage Vs (in the unit of V) of the substrate, and the potential Vr (in the unit of V) of the ring electrode 3 satisfies the following inequality: $\{(Vr-Vs)/Ls\} \leq 3{,}000{,}000$ (V/m), the thin film may be more effectively formed. In such an embodiment, the electric field formed between the ring electrode 3 and the substrate 2 may be less than or equal to the insulation breakdown strength of air. In such an embodiment, by calculating the condition of providing E=3MV/m or less, when the relationship between a distance Ls (in the unit of m) from the upper surface of ring electrode 3 to the lower surface of substrate 2 and the voltage Vs (in the unit of V) of the substrate satisfies the following inequality: $\{(Vr-Vs)/Ls\} \leq 3{,}000{,}000$ (V/m), the thin film may be more effectively formed.

In an exemplary embodiment, the thin film may be effectively formed when satisfying the following inequality: $(Vr-Vs) \leq (Ls\rho g/6) \times (\pi D^3/2\gamma)^{1/3}$, where $\rho$ (in the unit of kilogram per cubic meter: kg/m$^3$) denotes a value of a specific gravity of the thin film-forming material 5, g (in the unit of square meter per second: m$^2$/s) denotes a value of gravitational acceleration, D (in the unit of meter: m) denotes a value of a diameter of liquid droplets, and $\gamma$ (in the unit of Newton per meter: N/m) denotes a value of a surface tension of the liquid droplets.

The liquid droplets have a charge and are drawn to the electric field formed by the ring electrode 3 and the substrate 2 to be attached to the substrate 2. As the substrate 2 is placed above the thin film-forming material 5, the liquid droplets need to overcome gravity and air resistance to move upward. When air resistance and gravity are balanced with Coulomb force (qE), the relationship of Equation 4 may be obtained.

$$3\pi\eta DU - \pi/6 \times \rho g\, D^3 = q\,E \qquad \text{Equation 4}$$

Here, $\eta$ (in the unit of pascal second: Pas) denotes a viscosity of atmosphere, and U (in the unit of meter per second: m/sec) denotes a velocity. When the surface charge density of the liquid droplets is denoted by $\sigma$ (in the unit of coulomb per square meter: C/m$^2$), the Coulomb force may be defined as Equation 5.

$$q\,E = \pi D^2 \sigma[(Vr-Vs)/Ls] \qquad \text{Equation 5}$$

The condition that the liquid droplets do not exceed the Rayleigh instability is represented by the following Equation 6.

$$\sigma = (2\gamma/\pi D)^{1/2} \qquad \text{Equation 6}$$

Based on Equations 4, 5 and 6, Equation 7 may be obtained.

$$3\pi\eta DU = \pi D^2(2\gamma/\pi D)^{1/2}[(Vr-Vs)/Ls] + \pi/6 \times \rho g D^3 \qquad \text{Equation 7}$$

Here, $U \geq 0$ may be satisfied to allow liquid droplets to move upward by overcoming gravity and air resistance.

Inequality 1 may be obtained based on the condition satisfying $U \geq 0$ from Equation 7.

$$(Vr-Vs) \leq (Ls\rho g/6) \times (\pi D^3/2\gamma)^{1/2} \qquad \text{Inequality 1}$$

Accordingly, the liquid droplets may move upward when the Inequality 1 is satisfied.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film fabricating apparatus comprising:
   an electrode bath which contains a thin film-forming material;
   a plurality of needle electrodes disposed in the electrode bath;
   a plurality of ring electrodes disposed on the electrode bath at positions corresponding the needle electrodes; and
   a substrate stand disposed opposite to the needle electrodes and the ring electrodes, wherein the substrate stand holds a substrate on which a thin film is to be formed,
   wherein the substrate stand comprises a reversing unit which reverses the substrate upside down, and the reversing unit comprises
   a conveyor belt, and
   a fixing unit which comprises a reduced pressure suction apparatus, the fixing unit fixes the substrate onto the conveyor belt.

2. The apparatus of claim 1, wherein each of the plurality of needle electrodes is disposed at a center axis of each of the plurality of ring electrodes corresponding thereto.

3. The apparatus of claim 2, the apparatus further comprising
   a first power source which applies a first voltage to the plurality of needle electrodes,
   a second power source which applies a second voltage to the plurality of ring electrodes, and
   a third power source which applies a third voltage to the substrate,
   wherein,
   the second voltage has a same polarity as a polarity of the first voltage and an absolute value less than an absolute value of the first voltage, and
   the third voltage has an opposite polarity to the polarity of the first voltage, or has the same polarity as the polarity of the first voltage and an absolute value less than the absolute value of the first voltage.

4. The apparatus of claim 1, further comprising:
   a supplying unit which supplies the thin film-forming material to the electrode bath, and
   a collecting unit which collects the thin film-forming material flowing from the electrode bath.

5. The apparatus of claim 4, wherein the electrode bath comprises a level controlling unit which allows the thin film-forming material to flow into the collecting unit such that a level of thin film-forming material is maintained at a first height.

6. The apparatus of claim 5, wherein a height of the plurality of needle electrode is higher by a length in a range of about 0.15 mm to about 4 mm than the first height.

7. The apparatus of claim 4, wherein
   the electrode bath is sloped by a predetermined angle to flow the thin film-forming material in a predetermined direction,
   the supplying unit comprises a manifold and a slit, wherein the supplying unit supplies the thin film-forming material consistently at a first height by dispersing the thin film-forming material onto the sloped surface of the electrode bath, and the collecting unit is disposed at a lower end of the sloped surface of the electrode bath.

8. The apparatus of claim 7, wherein the height of the plurality of needle electrode is higher by a length in a range of about 0.15 millimeter to about 4 millimeters than the first height.

9. The apparatus of claim 1, wherein the reversing unit further comprises:

a rotating unit which drives the conveyor belt and rotates the substrate fixed on the conveyor belt by the fixing unit.

10. The apparatus of claim 1, wherein the rotating unit comprises a triangle roller.

11. The apparatus of claim 1, wherein a terminal end of the plurality of needle electrodes has at least one of a pointed shape, a flat shape, a dome shape, a circular cylinder shape, a polygonal cylinder shape, and a caldera shape.

12. The apparatus of claim 1, further comprising:

a first power source which applies a first voltage to the plurality of needle electrodes, a second power source which applies a second voltage to the plurality of ring electrodes, a third power source which applies a third voltage to the substrate, and the apparatus satisfying the following inequality: $(Vn-Vr)/Lr \le 3{,}000{,}000$ (V/m), wherein Lr denotes a value of a distance between a lower end of the plurality of ring electrodes and an upper surface of the thin film forming material in the unit of meter, Vn denotes the first voltage in the unit of volt, and Vr denotes the second voltage in the unit of volt.

13. The apparatus of claim 1, further comprising:

a first power source which applies a first voltage to the plurality of needle electrodes, a second power source which applies a second voltage to the plurality of ring electrodes, a third power source which applies a third voltage to the substrate, and the apparatus satisfying the following inequality: $(Vr-Vs)/Ls \le 3{,}000{,}000$ (V/m), wherein Ls denotes a value of a distance between the upper end of the plurality of ring electrodes and the lower surface of the substrate in the unit of meter, Vr denotes the second voltage in the unit of volt, and Vs denotes the third voltage in the unit of volt.

14. The apparatus of claim 1, further comprising:

a first power source which applies a first voltage to the plurality of needle electrodes, a second power source which applies a second voltage to the plurality of ring electrodes, and a third power source which applies a third voltage to the substrate, and the apparatus satisfying the following inequality: $(Vr-Vs) \le (Ls\rho g/6) \times (\pi D^3/2\gamma)^{1/3}$, wherein Ls denotes a value of a distance between the upper end of the plurality of ring electrodes and the lower surface of the substrate, Vr denotes the second voltage in the unit of volt, Vs denotes the third voltage in the unit of volt, ρ denotes a value of specific gravity of the thin film-forming material in the unit of kilogram per cubic meter, g denotes a value of gravitational acceleration in the unit of square meter per second, D denotes a value of a diameter of the liquid droplet of the thin film-forming material in the unit of meter, and γ denotes a value of surface tension of the liquid droplet of the thin film-forming material in the unit of Newton per meter.

15. The apparatus of claim 1, wherein the plurality of needle electrodes comprises at least one of stainless steel, tungsten and platinum.

\* \* \* \* \*